United States Patent
Goo et al.

[11] Patent Number: 5,989,983
[45] Date of Patent: Nov. 23, 1999

[54] METHOD OF FABRICATING AND CURING SPIN-ON-GLASS LAYERS BY ELECTRON BEAM IRRADIATION

[75] Inventors: Ju-seon Goo, Kyungki-do; Ji-hyun Choi, Seoul; Byung-keun Hwang; Hae-jeong Lee, both of Kyungki-do, all of Rep. of Korea

[73] Assignee: Samsung Electronics Co., Ltd., Rep. of Korea

[21] Appl. No.: 08/921,621

[22] Filed: Aug. 27, 1997

[30] Foreign Application Priority Data

Sep. 13, 1996 [KR] Rep. of Korea ................ 96-39844

[51] Int. Cl.⁶ ............................................. H01L 21/322
[52] U.S. Cl. ..................... 438/473; 438/474; 438/471; 438/477; 438/782; 438/783; 438/798; 438/800; 438/624; 438/631; 438/697
[58] Field of Search ............................. 438/624, 782, 438/783, 798, 800, 631, 697, 477, 471, 473, 474

[56] References Cited

U.S. PATENT DOCUMENTS

| | | | |
|---|---|---|---|
| 4,983,546 | 1/1991 | Hyun et al. | 437/231 |
| 5,118,530 | 6/1992 | Hanneman et al. | 427/226 |
| 5,192,697 | 3/1993 | Leong | 437/37 |
| 5,609,925 | 3/1997 | Camilletti et al. | 427/503 |
| 5,759,906 | 6/1998 | Lou | 438/623 |

*Primary Examiner*—John F. Niebling
*Assistant Examiner*—David A. Zarneke
*Attorney, Agent, or Firm*—Myers Bigel Sibley & Sajovec

[57] ABSTRACT

An insulating layer may be fabricated on a microelectronic substrate by spinning a layer of spin-on-glass (SOG) on a microelectronic substrate and curing the SOG layer by irradiating the SOG layer with an electronic beam. Irradiating may take place simultaneously with heating the substrate to a temperature below about 500° C. An underlying and/or overlying capping layer may also be provided. Alternatively, rather than irradiating the SOG layer, an overlying capping layer may be irradiated.

27 Claims, 5 Drawing Sheets

METHOD OF FABRICATING AND CURING SPIN-ON-GLASS LAYERS BY ELECTRON BEAM IRRADIATION

FIELD OF THE INVENTION

This invention relates to microelectronic devices, and more particular to methods of fabricating insulating layers for microelectronic substrates.

BACKGROUND OF THE INVENTION

Insulating layers are widely used on microelectronic substrates, such as integrated circuit substrates. As the integration density of integrated circuit substrates continues to increase, the step heights on the microelectronic substrates may continue to increase. For example, as integrated circuit memory devices become more highly integrated, three-dimensional capacitors may be used which may create step heights of 1 μm or more. These larger step heights may make it more desirable to include insulating layers which can planarize these steps. The planarized steps may allow thinner conductive layers and wider ranges of materials to be used for conductive layers.

Insulating layers are used in integrated circuits in at least three applications. An insulator may be used as an interlayer dielectric (ILD) beneath a patterned conductive layer. An insulating layer may be used as an intermetallic dielectric (IMD) between patterned conductive layers. Finally, an insulating layer may be used as a passivation layer on the outer surface of a conductive layer. In all of these applications, it may be desirable to provide an insulating layer having good planarization characteristics.

Borophosphosilicate silicon glass (BPSG) reflow has been proposed to provide planarized insulating layers. In a BPSG reflow, BPSG is formed on a microelectronic substrate and then reflowed at high temperatures of about 850° C. for thirty minutes. Unfortunately, these reflow temperatures may be excessively high for highly integrated circuits.

Planarized dielectric layers have also been provided by etching 03-tetraethyl orthosilicate undoped silicate glass (03-TEOS USG). Unfortunately, the etch-back of 03-TEOS USG may introduce complicated processing steps.

Spin-on-glass (SOG) has also been used to obtain planarized insulating layers which can be fabricated at low temperatures using simplified processing. Silicate (Si(OH)4), siloxane ((RO)nSi(OH)4-n) and silsesquioxane types are widely used for SOG materials. The silicate and siloxane are generally mixed with an alcohol-based solvent such as methanol, ethanol, propanol, butanol, pentanol, hexanol, methyl cellosolve, butyl cellosolve, propylene glycol, diethylene glycol, or carbinol.

An SOG layer is generally formed on a microelectronic substrate by coating the SOG material mixed with one or more of the above-described solvents on a microelectronic substrate, and then rotating the substrate to uniformly distribute the material. The SOG material in the liquid state can fill grooves or trenches in the substrate to thereby planarize the substrate.

The solvent is then generally evaporated by baking. The evaporated solvent and a carbon component generated from the solvent are generally degassed at approximately 100–400° C.

The SOG layer is then cured, for example by heating. In particular, the silicate or siloxane material is heated so that silanol (Si—OH) groups in the materials can produce $H_2O$ and cross-link to form a Si—O—Si network, thereby resulting in a solid SOG layer. The solid layer has properties which are similar to those of a conventional $SiO_2$ layer.

When the siloxane or the silicate material is heated, water is generally produced. Accordingly, the volume of the SOG layer is generally reduced during the curing process. Also, the siloxane SOG generally includes some alkyl groups at the position of the silanol group, so that the area of cross-linking may be reduced, to thereby cause less volume reduction.

Unfortunately, the curing process may generate stress in the SOG layer and thereby cause cracks therein. Siloxane SOG may have good crack resistance when it is thickly coated. Silicate SOG is generally more rigid and may create cracks during heat treatment, even when thickly coated.

The SOG curing process generally uses a furnace, oven or hotplate. For example, the microelectronic substrate is heat-treated at a temperature below 350° C. on a hotplate, and is then heat-treated at a temperature below 500° C. for 30–60 minutes in a furnace.

SOG layers may also be hygroscopic during subsequent processing or merely due to the lapse of time. When moisture is absorbed due to the hygroscopicity, the cross-linking may be destroyed and thereby adversely impact the properties of the SOG layer. In particular, as the hygroscopicity increases, the dielectric property of the SOG insulating layer may decrease. Accordingly, it is desirable to reduce or eliminate the problems of cracking and hygroscopicity in SOG layers.

Additional problems may be created when SOG is used for an intermetallic dielectric (IMD) layer between conductive interconnections. In this environment, a "poisoned via" phenomenon may take place wherein the SOG material which is exposed on the sidewall of a via may cause an increase in the contact resistance. In particular, when the poisoned via phenomenon occurs, outgassing may occur in the SOG of the via sidewall which is exposed when a metal layer is deposited, which may cause large contact resistance.

It is known that the poisoned via phenomenon may be caused by the silanol (Si—OH) group in the SOG material. For example, when an aluminum layer is deposited on the Si—OH group, an oxide layer of $Al_2O_3$ may be formed, which may thereby increase the contact resistance. Also, when an $O_2$ plasma treatment for striping photoresist is performed, the amount of Si—OH in the SOG layer may increase and the contact resistance may further deteriorate.

In order to reduce the contact resistance, it is known to seal the SOG exposed on the via sidewall using Ti or TiN. Methods for eliminating the SOG in the via by etchback have also been proposed. Unfortunately, the sealing of the SOG on the via sidewall may use a complicated process. Moreover, it may be difficult to detect an end-point during the etchback process. SOG may therefore remain on the via sidewall, resulting in high contact resistance.

Accordingly, in order to effectively use SOG as an insulating layer for microelectronic devices, it is desirable to reduce or eliminate problems with cracking, hygroscopicity and high contact resistance. It is believed that all of these problems may result from the high temperature curing which is used to eliminate moisture and the silanol group from the SOG. Unfortunately, if the curing temperature is lowered, the moisture and the silanol group may not be completely eliminated and the etch rate of the SOG layer may be increased, thereby causing an increase in the size of the contact holes. Accordingly, it is desirable to increase the curing temperature in SOG while simultaneously preventing cracking. Alternatively, it is desirable to lower the curing temperature while simultaneously eliminating moisture and the silanol group.

It has been previously proposed to use ultraviolet (UV) light irradiation and ion implantation to lower the curing temperature SOG while simultaneously eliminating moisture and the silanol group. In particular, U.S. Pat. No. 4,983,546 to Hyun et al. entitled "Method for Curing Spin-On-Glass Film by Utilizing Ultraviolet Irradiation" discloses a method for curing spin-on-glass by establishing a predetermined initial temperature in a heating chamber with an ultraviolet light source, introducing a wafer into the heated chamber, and gradually increasing the temperature to a predetermined maximum temperature. The SOG film is irradiated with ultraviolet light at a predetermined wavelength simultaneously with the application of heat at the maximum temperature for a predetermined time. The wafer is then cooled.

U.S. Pat. No. 5,192,697 to Leong entitled "SOG Curing by Ion Implantation" discloses implantation of ions such as argon or arsenic into a spin-on-glass layer. The action of the ions moving through the spin-on-glass layer causes internal heating. The heating cures the spin-on-glass layer.

Notwithstanding the above advances, it is desirable to provide improved methods of curing SOG at lower temperatures, to thereby prevent cracks and eliminate moisture and silanol groups from spin-on-glass.

SUMMARY OF THE INVENTION

It is therefore an object of the present invention to provide improved methods of forming and curing spin-on-glass (SOG) layers on a microelectronic substrate.

It is another object of the present invention to provide methods of forming and curing SOG layers which can reduce or prevent cracks and reduce or eliminate moisture and silanol groups.

It is still another object of the present invention to provide methods of forming and curing SOG layers which can reduce contact resistance of conductive layers formed thereon.

These and other objects are provided according to the present invention, by curing a spin-on-glass (SOG) layer on a microelectronic substrate by irradiating the SOG layer with an electron beam. The irradiating step preferably is performed simultaneously with the step of heating the microelectronic substrate to a temperature below about 500° C. Improved SOG layers may thereby be provided with improved crack resistance and reduced moisture and silanol groups. Reduced contact resistance of conductive layers formed on the SOG layer may also be obtained.

In particular, according to the present invention, the SOG layer is irradiated by placing the SOG layer adjacent an electron beam cathode in an electron beam chamber and applying voltage between about 500 and 30,000 volts to the cathode, to thereby generate an electron beam. The electron beam is preferably of at least the same size as the SOG layer.

Accordingly, planarized insulating layers may be fabricated on a patterned underlayer on a microelectronic substrate by spinning a layer of SOG on the underlayer and curing the SOG layer by irradiating the SOG layer with an electron beam. The microelectronic substrate is preferably simultaneously heated to a temperature below about 500° C.

Prior to spinning a layer of SOG on the underlayer, a first capping layer may be formed on the underlayer. Moreover, after the curing step, a second capping layer may be formed on the irradiated SOG layer. The first capping layer may comprise a chemical vapor deposited oxide layer or a low temperature oxide layer. The first and second capping layers may also comprise $SiO_2$, SiON, SiOF or SiN. The SOG preferably comprises hydrogen silsesquioxane (HSQ).

According to another aspect of the present invention, a capping layer on an SOG layer is irradiated with an electron beam rather than irradiating the SOG layer itself. By not irradiating the SOG layer itself, the low permittivity of the SOG layer may be preserved, while still providing a rigid insulating layer.

In particular, according to this aspect of the present invention, an SOG layer is spun on a microelectronic substrate and a capping layer is formed on the SOG layer. The capping layer is irradiated with an electron beam. The SOG layer is preferably cured prior to forming the capping layer thereon. Curing may take place by thermally curing the SOG layer below 450° C.

A second capping layer may be formed on the microelectronic substrate prior to spinning on the SOG. A third capping layer may be formed on the capping layer after electron beam radiation. The capping layers are preferably formed of at least one material selected from the group consisting of $SiO_2$, SiON, SiOF and SiN. Accordingly, low permittivity and high strength insulating layers may be provided.

DETAILED DESCRIPTION OF PREFERRED EMBODIMENT

Figure 1A:
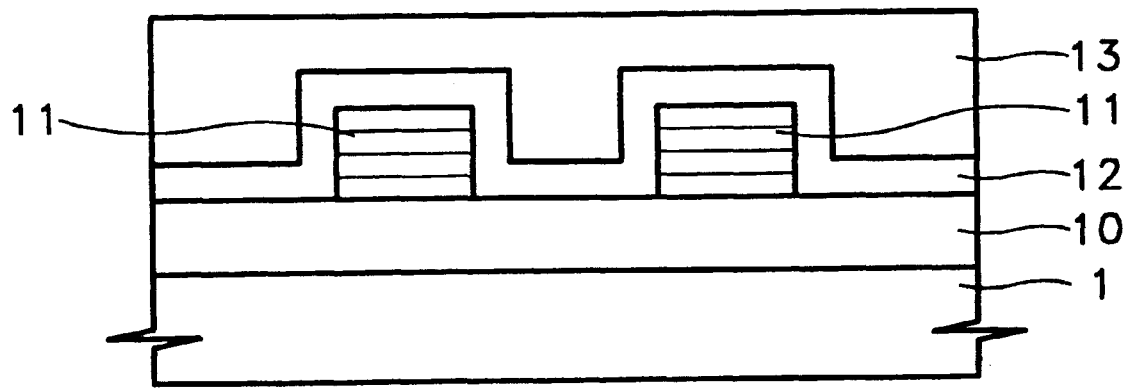
FIGS. 1A through 1D are cross-sectional views sequentially illustrating methods for fabricating SOG layers according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Referring to FIG. 1A, an insulating layer 10, a patterned conductive layer such as metal 11, a first capping layer 12 and a spin-on-glass (SOG) layer 13 are sequentially formed on a microelectronic substrate such as integrated circuit substrate 1. The SOG layer 13 can be formed without forming the first capping layer 12, to thereby form a direct-on-metal (DOM) structure. The first capping layer 12 may be formed of a chemical vapor deposited (CVD) oxide or a low-temperature oxide (LTO). Preferably, the first capping layer is formed of $SiO_2$, SiON, SiOF, or SiN.

Since SOG is spun on in liquid form, the SOG can fill narrow spaces or trenches without generating voids. When the SOG material, such as siloxane or silicate mixed with an alcoholic solvent, is baked, the solvent is evaporated and a solid layer remains. The properties of the solid layer may be similar to those of a conventional $SiO_2$ layer.

According to the present invention, both an organic SOG and an inorganic SOG can be used. The organic SOG may provide process simplification, excellent planarization, and may allow a low-temperature heat treatment process. However, the organic SOG may generate carbon components, and cracks may be generated at 600° C. or higher.

When hydrogen silsesquioxane (HSQ), an inorganic SOG, is used, a layer of 3000 or thicker can be formed by spin coating. The HSQ, unlike conventional SOG, may self-flow at a predetermined temperature, which may lead to better planarization and excellent crack resistance at temperatures of 700° C. or higher. The crack resistance during the heat-treatment may facilitate subsequent processing, such as formation of the capping layer. Accordingly, HSQ may be a preferred SOG material.

HSQ is an inorganic SOG having a dielectric constant of approximately 3 at 400° C. However, unlike the conventional inorganic SOG, HSQ may be coated to a thickness of 4000 Å or more in only one coating. Moreover, HSQ may have such good crack resistance that cracks may not be generated despite large step differences. Also, unlike the conventional organic SOG, the HSQ does not contain carbon, thereby producing little $O_2$ plasma effect during photoresist stripping.

Figure 1B:
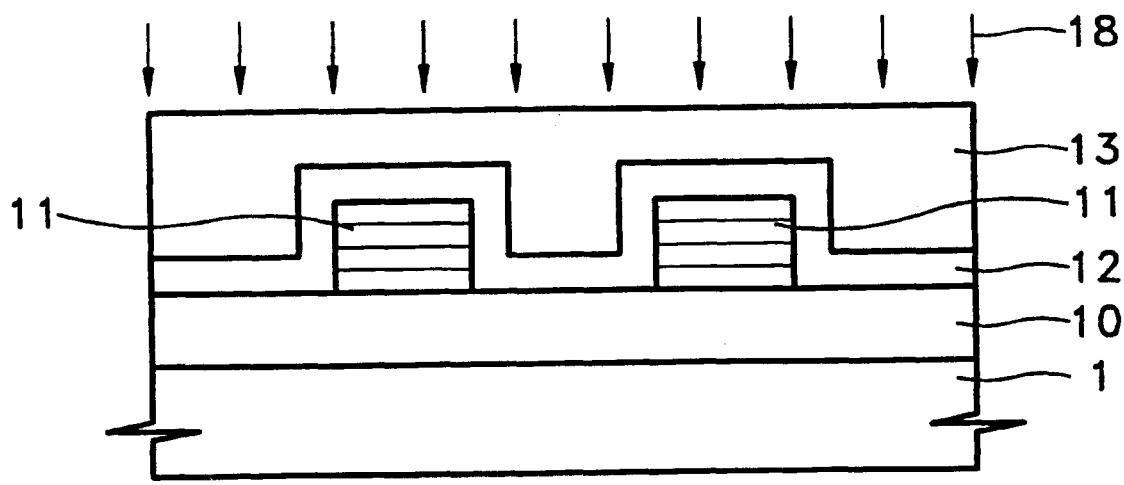

FIG. 1B shows the step of curing the HSQ using an electron beam 18. When the electron beam 18 is used, the curing can be performed at room temperature. An SOG layer having a thickness of approximately 20 $\mu$m at 30 KeV can be cured.

According to the present invention, it is desirable that an electron beam irradiator have an electron emission size which is large enough to irradiate the entire substrate. It is further desirable that the irradiator include a glow discharge cathode.

The irradiation of electron beams 18 may be performed in a vacuum chamber (not shown) containing a predetermined gas. Nitrogen, helium or argon can be used.

In particular, a substrate is mounted on a target plane, and the pressure of the vacuum chamber is lowered to about 1–200 mb. The pressure may be controlled by a leak valve attached to the vacuum chamber. A voltage of between about 500 and 30,000 volts is applied to a cathode to emit electrons.

The electrons ionize gas which is present between the cathode and the target. A positive ion generated during the ionization rushes toward the cathode through an accelerating region to strike the surface of the cathode. Secondary electrons emitted from the cathode are directed toward the target, to thereby form the electron beam.

An accelerating region is provided in the space between a grid having a fine mesh and the cathode. When a negative voltage of about 0–10 volts is applied to the grid, the positive charge proceeding toward the grid passes through the mesh of the grid and is accelerated at a high energy level toward the cathode.

The electron beam enables the HSQ layer to be cured at a temperatures between room temperature and 500° C. Also, compared with conventional UV irradiation or heat treatment, the electron beam can cause rapid curing and a more rigid SOG layer 13'. Electron beam irradiation according to the present invention may be performed with a current of between about 1 and 20 mA and with a voltage of about 500 to 30,000 volts applied to the cathode.

Table 1 shows HSQ shrinkage percentage after electron beam curing for four experiments.

TABLE 1

| EXPERI-MENT NO. | THICKNESS (Å) | | SHRINKAGE PERCENTAGE(%) |
|---|---|---|---|
| | BEFORE CURING | AFTER CURING | |
| 1 | 3524 | 2486 | 29 |
| 2 | 3587 | 2508 | 30 |
| 3 | 3591 | 2499 | 30 |
| 4 | 3598 | 2533 | 31 |

As shown in Table 1, the HSQ layer shrinks by approximately 30% after curing, which results in a rigid HSQ layer.

Figure 1C:
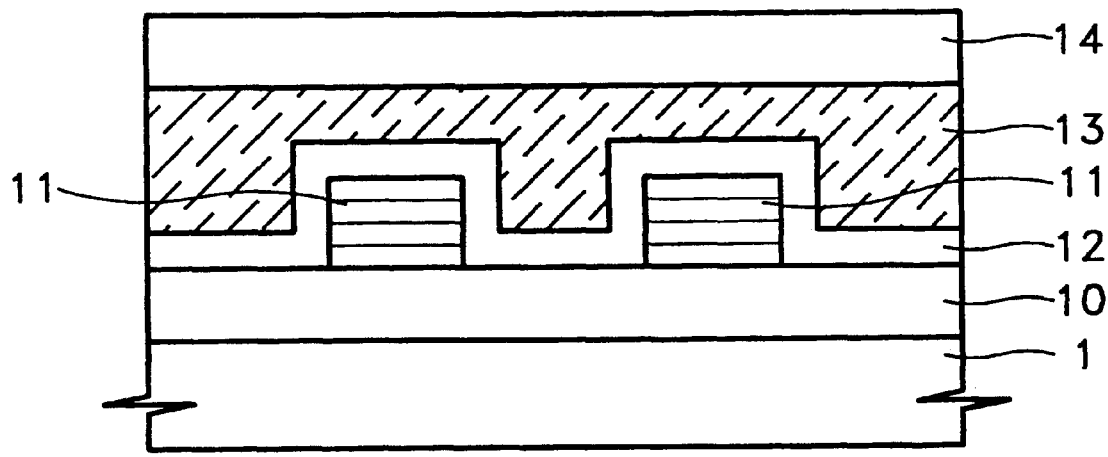

Referring to FIG. 1C, a second capping layer 14 is formed on the cured HSQ layer 13'. The second capping layer 14 may be formed by treating the HSQ layer 13' with $O_2$ plasma or by depositing a CVD oxide layer or a low-temperature oxide layer at 200° C. or higher. The second capping layer 14 is preferably formed of $SiO_2$, SiON, SiOF, or SiN. The second capping layer 14 may not only stabilize and densify the HSQ layer 13', but may also prevent the HSQ layer 13' from being hygroscopic during subsequent process steps.

The second capping layer 14 is heat-treated for 30 minutes at 500° C. or higher. However, when the temperature used in forming the second capping layer 14 is 500° C. or higher, the heat treatment may be omitted.

Figure 1D:
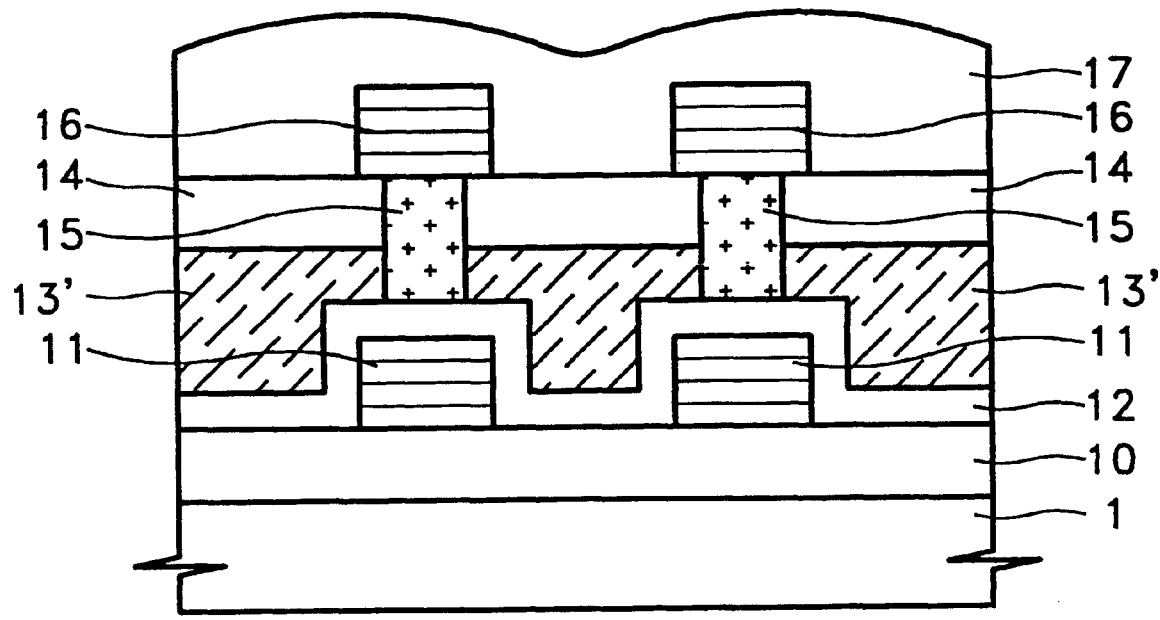

Referring to FIG. 1D, vias 15 are formed and a conductor such as metal is sequentially deposited and patterned, to thereby form a second metal layer 16. A passivation layer 17 is then deposited on the second metal 16. HSQ also can be used for the passivation layer 17, and an electron beam can be used for curing the HSQ passivation layer 17.

As shown in FIG. 1D, HSQ layer 13' forms a portion of sidewall of conductive via 15. Since the HSQ layer according to the present invention is cured by an electron beam at room temperature to 500° C., to dehydrate silanol groups, the HSQ layer 13' need not expose silanol groups on the sidewall of the via 15. Accordingly, the poisoned via phenomenon may be reduced or eliminated and the contact resistance need not increase.

Figure 2:
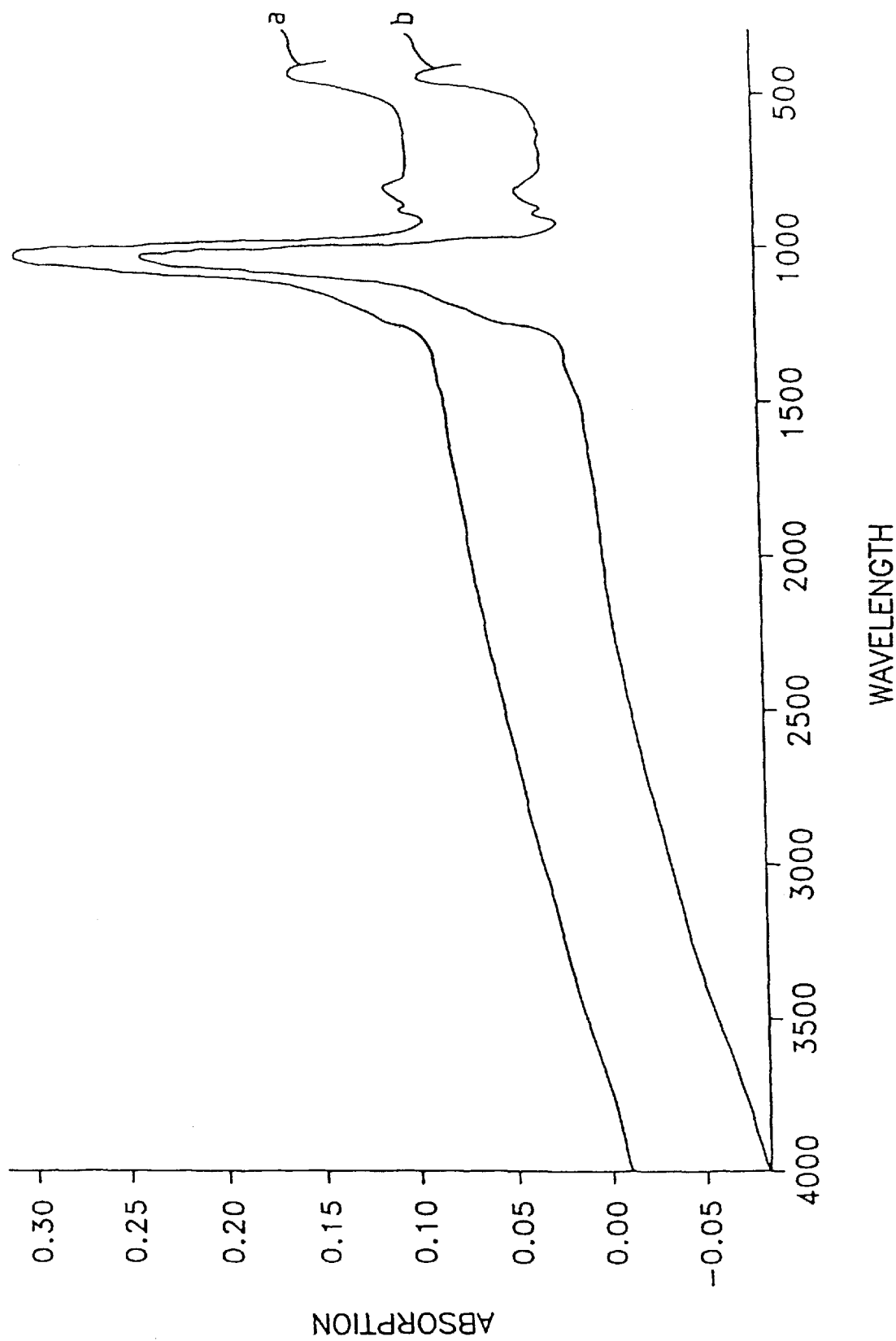
FIG. 2 shows a spectroscopy plot of Fourier Transform InfraRed (FTIR) before and after an $O_2$ plasma process with respect to an HSQ layer.

FIG. 2 shows a Fourier Transform InfraRed (FTIR) spectroscopy plot before and after the step of treating the HSQ layer with $O_2$ plasma. Graph a illustrates absorption versus wavelength after treating with $O_2$ plasma and graph b illustrates absorption versus wavelength before treating with $O_2$ plasma. As shown in the graphs, in SOG layers according to the present invention, $H_2O$ at 3500 $cm^{-1}$ and Si—OH group at 980 $cm^{-1}$ do not occur before and after the $O_2$ plasma process.

Table 2 shows failure in via contact resistance measured at 350° C. when the HSQ electron beam curing is applied to an IMD process with no-etchback. The measurement was performed by varying the via size and the elapsed time. The number of vias measured was 135.

TABLE 2

| SIZE OF VIA ($\mu$m) | 0.72 × 0.8 | | | 0.56 × 0.64 | | | 0.48 × 0.56 | | |
|---|---|---|---|---|---|---|---|---|---|
| ELAPSED TIME (Hr.) | EARLY | 100 | 300 | EARLY | 100 | 300 | EARLY | 100 | 300 |
| NUMBER OF FAILED VIAS | 3 | 3 | 3 | 3 | 3 | 4 | 1 | 1 | 1 |

As shown in Table 2, in SOG layers according to the present invention, via failure due to high contact resistance is not increased or reduced over time.

It will be understood that electron beam curing of SOG according to the invention may also be applied to SOG which is used in IMD etchback, IMD non-etchback, IMD DOM, ILD, and passivation layers. According to the present invention, electron beam curing may be performed at room temperature to 500° C., to thereby allow an increase in crack resistance and density of the SOG layer as well as to prevent damage to the SOG layer during following $O_2$ plasma processing. Also, hygroscopicity and contact resistance may be reduced during the curing process.

Referring now to FIGS. 3A–3D, another embodiment of the present invention will now be described. When directly irradiating SOG material with an electron beam as described above, the permittivity of the SOG material may increase. Thus, although high strength SOG layers may be provided, the increased permittivity may generate an RC time delay in integrated circuit substrates which use metal wiring layers and SOG insulating layers. As is well known to those having skill in the art, R denotes the resistance of the metal wiring layer and C denotes the capacitance of the SOG insulating layer.

In order to preserve the low permittivity of the SOG layer, the SOG layer may not be directly exposed to the electron beam irradiation. Rather, the SOG layer is thermally cured at a predetermined temperature and a capping layer thereon is irradiated by an electron beam. Thus, the low permittivity of the SOG layer may be preserved, and a rigid film may be provided by the rigid capping layer between metal wiring layers.

Figure 3A:
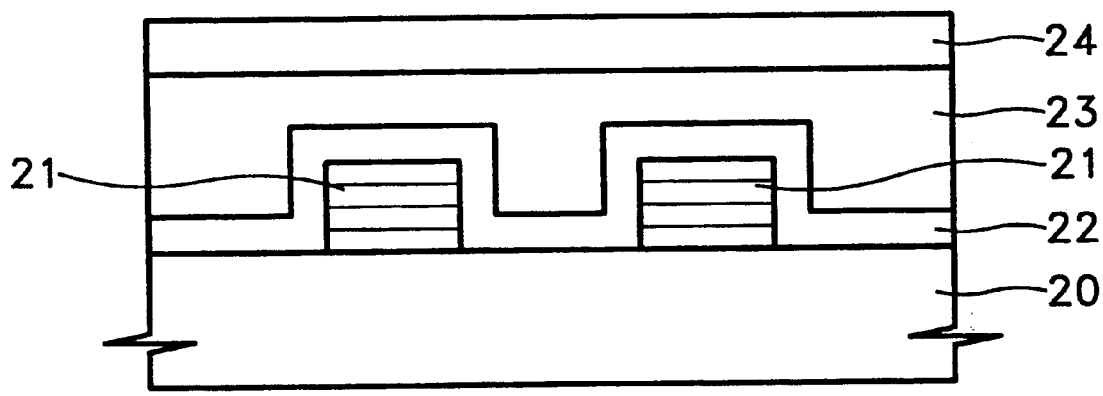
FIGS. 3A through 3D are cross-sectional views sequentially illustrating methods of fabricating insulating layers according to the present invention.

Referring now to FIG. 3A, a first patterned conductive layer 21 such as metal is formed on an integrated circuit substrate, such as a semiconductor substrate 20. A first Chemical Vapor Deposition (CVD) capping layer 22 is then optionally formed on the structure. However, an SOG layer may be formed without forming the first CVD capping layer 22, to provide a direct-on-metal structure. The first patterned conductive layer is preferably formed of titanium nitride (TiN), titanium (Ti), aluminum (Al), copper (Cu), doped polysilicon, titanium silicide (TiSix), or tungsten silicide (WSix).

Still referring to FIG. 3A, an SOG material is coated and thermally cured below 450° C. to form an SOG layer 23. The curing is performed thermally so that the low permittivity of the SOG layer 23 may be preserved. The SOG layer may not be formed between the metal wiring layers.

Still referring to FIG. 3A, a second capping layer 24 having thickness of about 100 Å–5000 Å, is then formed on the SOG layer 23. The first capping layer 22 and the second capping layer 24 are preferably formed of $SiO_2$, SiON, SiOF and/or SiN.

Figure 3B:
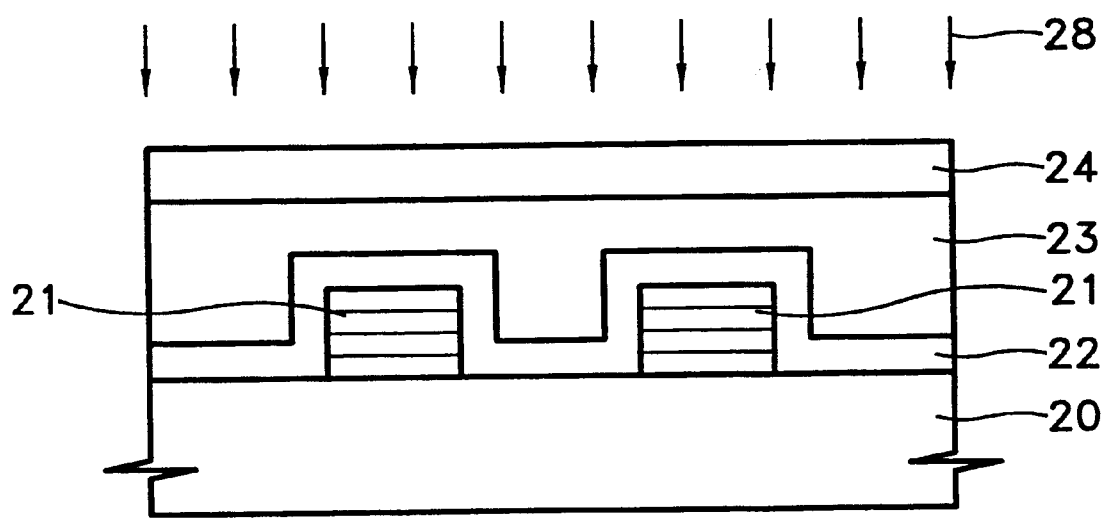
Figure 3C:
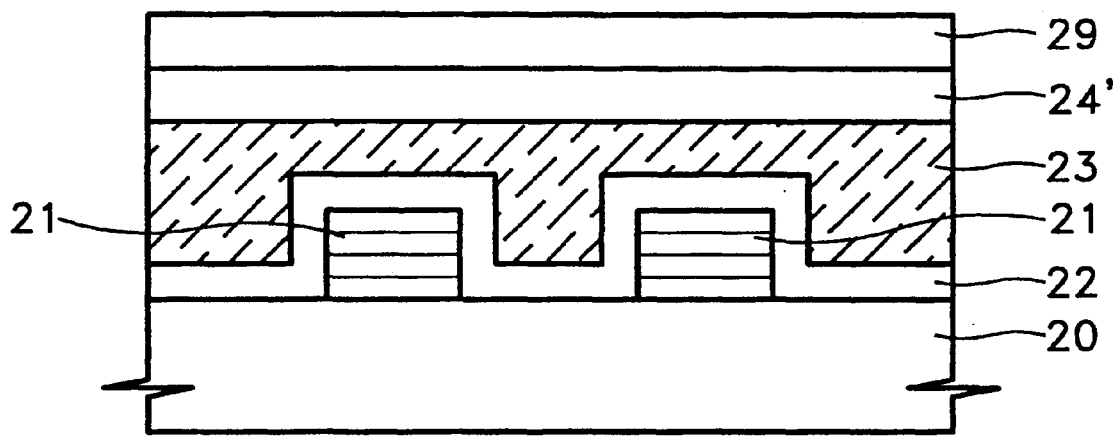

Referring to FIG. 3B, an electron beam 28 is irradiated onto the second capping layer 24. Irradiation may take place as was already described in connection with FIG. 1B. As a result, rigidity is provided where a metal contact is to be formed, while preserving the low permittivity of the SOG layer 23. Referring to FIG. 3C, a third CVD capping layer 29 is optionally formed on the second capping layer 24' irradiated by the electron beam 28.

Figure 3D:
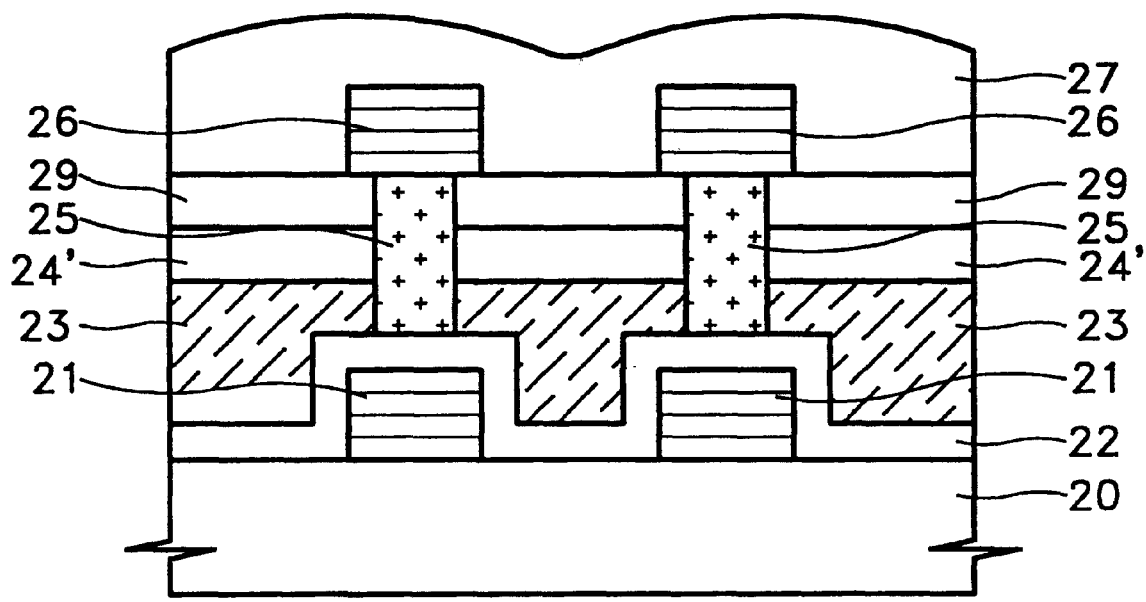

Referring to FIG. 3D, a second patterned conductive layer 29 such as metal is formed, electrically connecting with the first patterned conductive layer 21 through a via 25. Second patterned conductive layer 29 may be formed as was described in connection with FIG 1D. A passivation layer 27 may also be formed to cover the structure.

In the drawings and specification, there have been disclosed typical preferred embodiments of the invention and, although specific terms are employed, they are used in a generic and descriptive sense only and not for purposes of limitation, the scope of the invention being set forth in the following claims.

We claim:

1. A method of fabricating an insulating layer on a microelectronic substrate comprising the steps of:

spinning a layer of spin-on-glass (SOG) on the microelectronic substrate;

forming a capping layer on the SOG layer; and irradiating the capping layer with an electron beam.

2. A method according to claim 1 wherein the following step is performed simultaneously with the irradiating step:

heating the microelectronic substrate to a temperature below about 500° C.

3. A method according to claim 1 wherein the irradiating step comprises the step of irradiating the capping layer with an electron beam of at least same size as the SOG layer.

4. A method according to claim 1 wherein the irradiating step comprises the steps of:

placing the capping layer adjacent an electron beam cathode in an electron beam chamber; and applying voltage between about 500 and 30,000 volts to the cathode to thereby generate an electron beam.

5. A method according to claim 1 wherein the following step is performed between the spinning step and the forming step:

curing the SOG layer.

6. A method according to claim 5 wherein the curing step comprises the step of thermally curing the SOG layer below 450° C.

7. A method according to claim 1 wherein the following step is performed prior to the spinning step:

forming a second capping layer on the microelectronic substrate; and wherein the spinning step comprises the step of spinning a layer of spin-on-glass (SOG) on the second capping layer.

8. A method according to claim 7 wherein the second capping layer is formed of at least one material selected from the group consisting of $SiO_2$, SiON, SiOF and SiN.

9. A method according to claim 1 wherein the irradiating step is followed by the step of:

forming a third capping layer on the capping layer.

10. A method according to claim 1 wherein the capping layer is formed of at least one material selected from the group consisting of $SiO_2$, SiON, SiOF and SiN.

11. A method according to claim 1 wherein the irradiating step is followed by the step of:

forming a wiring layer on the capping layer.

12. A method according to claim 1 wherein the following step is performed before the spinning step:

forming a patterned wiring layer on the microelectronic substrate; and wherein the spinning step comprises the step of spinning a layer of spin-on-glass (SOG) on the microelectronic substrate including on the patterned wiring layer.

13. A method of fabricating a planarized insulating layer on an underlayer on a microelectronic substrate, comprising the steps of:

spinning a layer of spin-on-glass (SOG) on the underlayer;

forming a capping layer on the SOG layer; and irradiating the capping layer with an electron beam.

14. A method according to claim 13 wherein the spinning step is preceded by the step of forming a first capping layer on the underlayer.

15. A method according to claim 13 wherein the irradiating step is followed by the step of forming a second capping layer on the irradiated capping layer.

16. A method according to claim 14 wherein the first capping layer comprises a CVD oxide layer or an LTO oxide layer.

17. A method according to claim 14 wherein the first capping layer comprises $SiO_2$, SiON, SiOF or SiN.

18. A method according to claim 15 wherein the second capping layer comprises $SiO_2$, SiON, SiOF or SiN.

19. A method according to claim 13 wherein the SOG comprises hydrogen silsesquioxane.

20. A method according to claim 13 wherein the following step is performed simultaneously with the irradiating step:

heating the microelectronic substrate to a temperature below about 500° C.

21. A method according to claim 13 wherein the irradiating step comprises the step of irradiating the capping layer with an electron beam of at least same size as the SOG layer.

22. A method according to claim 13 wherein the irradiating step comprises the steps of:

placing the capping layer adjacent an electron beam cathode in an electron beam chamber; and applying voltage between about 500 and 30,000 volts to the cathode to thereby generate an electron beam.

23. A method according to claim 13 wherein the following step is performed between the spinning step and the forming step:

curing the SOG layer.

24. A method according to claim 23 wherein the curing step comprises the step of thermally curing the SOG layer below 450° C.

25. A method according to claim 13 wherein the capping layer is formed of at least one material selected from the group consisting of $SiO_2$, SiON, SiOF and SiN.

26. A method according to claim 13 wherein the irradiating step is followed by the step of:

forming a wiring layer on the capping layer.

27. A method according to claim 13 wherein the following step is performed before the spinning step:

forming a patterned wiring layer on the microelectronic substrate; and wherein the spinning step comprises the step of spinning a layer of spin-on-glass (SOG) on the microelectronic substrate including on the patterned wiring layer.

* * * * *